United States Patent
Cherkassky et al.

(10) Patent No.: US 8,324,949 B2
(45) Date of Patent: Dec. 4, 2012

(54) ADAPTIVE QUADRATURE CORRECTION FOR QUADRATURE CLOCK PATH DESKEW

(75) Inventors: Alexander Cherkassky, Boyds, MD (US); David Elwart, Sachse, TX (US); Huanzhang Huang, Plano, TX (US); Li Yang, Allen, TX (US); Matt Rowley, Parker, TX (US); Mark W. Morgan, Allen, TX (US); Yanli Fan, Allen, TX (US); Yonghui Tang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 201 days.

(21) Appl. No.: 12/901,313

(22) Filed: Oct. 8, 2010

(65) Prior Publication Data

US 2012/0086489 A1 Apr. 12, 2012

(51) Int. Cl.
*H03K 3/017* (2006.01)
(52) U.S. Cl. ......................... 327/175; 327/172
(58) Field of Classification Search .................. None
See application file for complete search history.

(56) References Cited

U.S. PATENT DOCUMENTS

| | | | |
|---|---|---|---|
| 6,084,452 A | 7/2000 | Drost et al. | |
| 6,320,438 B1 * | 11/2001 | Arcus | 327/175 |
| 6,369,626 B1 * | 4/2002 | Donnelly et al. | 327/157 |
| 6,680,637 B2 * | 1/2004 | Seo | 327/175 |
| 6,819,728 B2 | 11/2004 | Boerstler | |
| 6,933,759 B1 | 8/2005 | Wu et al. | |
| 7,187,221 B2 * | 3/2007 | Kim et al. | 327/175 |
| 7,352,219 B2 * | 4/2008 | Minzoni | 327/175 |
| 7,501,870 B2 * | 3/2009 | Choi et al. | 327/175 |
| 7,525,359 B2 * | 4/2009 | Kim | 327/175 |
| 7,579,890 B2 * | 8/2009 | Sohn | 327/175 |
| 7,605,626 B2 * | 10/2009 | Hur | 327/175 |
| 7,839,194 B2 * | 11/2010 | Chang et al. | 327/175 |
| 8,004,331 B2 * | 8/2011 | Li et al. | 327/175 |
| 8,063,680 B2 * | 11/2011 | Choi | 327/158 |
| 2002/0085658 A1 | 7/2002 | Boerstler | |
| 2005/0134341 A1 * | 6/2005 | Lee | 327/172 |
| 2005/0174156 A1 * | 8/2005 | Wu et al. | 327/175 |
| 2008/0197903 A1 * | 8/2008 | Humble | 327/175 |
| 2009/0195283 A1 * | 8/2009 | Cho et al. | 327/175 |
| 2010/0213992 A1 * | 8/2010 | Hyun et al. | 327/147 |

* cited by examiner

*Primary Examiner* — Cassandra Cox

(74) *Attorney, Agent, or Firm* — John J. Patti; Wade J. Brady, III; Frederick J. Telecky, Jr.

(57) ABSTRACT

Quadrature clocking schemes are widely used in modern communications systems, but often suffer from phase imbalance. Conventional solutions that attempt to address this phase imbalance, however, are generally large and use a substantial amount of power. Here, however, a correction circuit is provided that can locally correct for phase imbalance without the need for bulky and high power consuming circuitry.

19 Claims, 5 Drawing Sheets

ADAPTIVE QUADRATURE CORRECTION FOR QUADRATURE CLOCK PATH DESKEW

TECHNICAL FIELD

The invention relates generally to clocking and, more particularly, to quadrature correction for a clock path.

BACKGROUND

Quadrature clocking schemes are widely used in modern communications systems, but often suffer from phase imbalance. The initial clock phases are typically generated by a central phase locked loop (PLL), but, during the routing and distribution process, the in-phase (I) and quadrature (Q) phases may become misaligned, particularly if the phases are provided across chip to multiple locations. Quadrature skew can be a phase deviation between the I and Q clocks from the ideal 90°, and quadrature skew is typically caused by the propagation time difference of the I and Q signals transmitting through corresponding channels. Differences in conductor length, trace geometry, via stubs, loading, buffer mismatch, supply differences and some other factors introduce quadrature skew. As the period of the clock decreases, quadrature skew is expected to become more pronounced. Additionally, duty cycle distortion can also be present. Quadrature skew and duty cycle distortion increase random and deterministic jitter and degrade the eye of a receiver.

There have been some attempts to solve problems associated with quadrature skew and duty cycle distortion, and, in FIG. 1, an example of a conventional clocking scheme or system 100 can be seen. Here, transmitter 102 transmits a clock signal CLK over a transmission medium 104 to a polyphase circuit 106 (which is adjacent to or "close to" a receiver 108). The polyphase circuit 106 can then generate the I (PH1 and PH3) and Q (PH2 and PH4) signals locally so as to avoid the quadrature skew and duty cycle distortion, which can occur by transmission these signals PH1 to PH4 over long transmission lines (i.e., 104). A problem with this system 100, however, is that the polyphase circuit 106 is generally comprised of PLLs and/or delay locked loops (DLLs) or other circuits, which can occupy a large amount of area and can consume a substantial amount of power. Therefore, there is a need for an improved clocking scheme or system.

Some other conventional circuits are: U.S. Pat. No. 6,084,452; U.S. Pat. No. 6,819,728; U.S. Pat. No. 6,933,759; and U.S. Patent Pre-Grant Publ. No. 2002/0085658.

SUMMARY

A preferred embodiment of the present invention, accordingly, provides an apparatus. The apparatus comprises a plurality of inner correction loops that each receive a pair of input signals and that each perform duty cycle correction for its pair of input signals; and an outer correction loop that is coupled to each of the inner correction loops, wherein the outer correction loops deskews each pair of input signals.

In accordance with a preferred embodiment of the present invention, each inner correction loop further comprises: an amplifier that receives its pair of input signals; and a duty cycle correction circuit that is coupled to the amplifier.

In accordance with a preferred embodiment of the present invention, the outer correction loop further comprises: an error detector that is coupled to each of the inner correction loops; an error amplifier that is coupled to the error detector; and a steering circuit that is coupled to the error amplifier and to each of the inner control loops.

In accordance with a preferred embodiment of the present invention, the error detector further comprises: a logic circuit that is coupled to each of the inner correction loops; a compensator that is coupled to the logic circuit; and a charge pump that is coupled between the compensator and the error amplifier.

In accordance with a preferred embodiment of the present invention, an apparatus is provided. The apparatus comprises a first amplifier that receives a first signal and a second signal; a second amplifier that receives a third signal and a fourth signal; a first duty cycle correction circuit that is coupled to the first amplifier; a second duty cycle correction circuit that is coupled to the second amplifier; an error detector that is coupled to the first amplifier and the second amplifier, wherein the error detector detects skew; a error amplifier that is coupled to the error detector; and a steering circuit that is coupled to the error amplifier, the first amplifier, and the second amplifier.

In accordance with a preferred embodiment of the present invention, the error detector further comprises: a logic circuit that is coupled to the first and second amplifiers; a compensator that is coupled to the logic circuit; and a charge pump that is coupled between the compensator and the error amplifier.

In accordance with a preferred embodiment of the present invention, the logic circuit further comprises: an XOR gate that is coupled between the first amplifier and the compensator; and an XNOR gate that is coupled between the second amplifier and the compensator.

In accordance with a preferred embodiment of the present invention, the compensator further comprises: a first inverter that is coupled to the XOR gate; a second inverter that is coupled to the XNOR gate; a third inverter that is coupled between the first inverter and the charge pump; a fourth inverter that is coupled between the second inverter and the charge pump; and a pair of cross-coupled inverters coupled to a node between the first and third inverters and to a node between the second and fourth inverters.

In accordance with a preferred embodiment of the present invention, each of the first and second amplifier further comprises: an input stage; an output stage that is coupled to the input stage, at least one of the first and second duty cycle correction circuits, and the error detector; and a steering stage that is coupled to the input stage and the steering circuit.

In accordance with a preferred embodiment of the present invention, the input stage further comprises: a pair of bias transistors that are each coupled to a voltage rail; a pair of differential input transistors, wherein each transistor of the pair is coupled to one of the bias transistors and to the steering stage.

In accordance with a preferred embodiment of the present invention, the steering stage further comprises a steering transistor that is coupled between the input stage and ground and that is coupled to the steering circuit.

In accordance with a preferred embodiment of the present invention, the output stage further comprises a plurality of output stages, and wherein each output stage is coupled to the steering stage.

In accordance with a preferred embodiment of the present invention, an apparatus is provided. The apparatus comprises a first amplifier having: a first input stage that receives a first signal and a second signal; a first output stage that is coupled to the first input stage; and a first steering stage that is coupled to the first input stage; a second amplifier having: a second input stage that receives a third signal and a fourth signal; a second output stage that is coupled to the second input stage; and a second steering stage that is coupled to the second input stage; a first duty cycle correction circuit that is coupled to the first output stage of the first amplifier; a second duty cycle correction circuit that is coupled to the second output stage of the second amplifier; an error detector having: a first logic gate that is coupled to the first output stage of the first amplifier; a second logic gate that is coupled to second output stage of the second amplifier; a compensator that is coupled to the first and second logic gates; and a charge pump that is coupled to the compensator; a error amplifier that is coupled to the charge pump of the error detector; and a steering circuit that is coupled to the error amplifier, first steering stage of the first amplifier, and the second steering stage of the second amplifier.

In accordance with a preferred embodiment of the present invention, the first logic gate further comprises an XOR gate, and wherein the second logic gate further comprises an XNOR gate, and wherein the compensator further comprises: a first inverter that is coupled to the XOR gate; a second inverter that is coupled to the XNOR gate; a third inverter that is coupled between the first inverter and the charge pump; a fourth inverter that is coupled between the second inverter and the charge pump; and a pair of cross-coupled inverters coupled to a node between the first and third inverters and to a node between the second and fourth inverters.

In accordance with a preferred embodiment of the present invention, the steering circuit further comprises: a first PMOS transistor that is coupled to a voltage rail at its source and that receives a bias voltage at its gate; a second PMOS transistor that is coupled to the drain of the first PMOS transistor at its source and that is coupled to the error amplifier at its gate; a third PMOS transistor that is coupled to the drain of the first PMOS transistor at its source and that is coupled to the error amplifier at its gate; a first NMOS transistor that is coupled to the drain of the second PMOS transistor at its drain and gate and that is coupled to ground at its source; and a second NMOS transistor that is coupled to the drain of the third PMOS transistor at its drain and gate and that is coupled to ground at its source.

In accordance with a preferred embodiment of the present invention, the bias voltage further comprises a first bias voltage, and wherein each of the first and second output stages and each of the first input stage further comprise: a fourth PMOS transistor that is coupled to the voltage rail at its source and that receives a second bias voltage at its gate; a fifth PMOS transistor that is coupled to the voltage rail at its source and that receives the second bias voltage at its gate; a third NMOS transistor that is coupled to the drain of the fourth PMOS transistor at its drain and at least one of the first and second steering circuits at its source and that receives at least one of the first and third signals at its gate; a fourth NMOS transistor that is coupled to the drain of the fifth PMOS transistor at its drain and at least one of the first and second steering circuits at its source and that receives the second signal at its gate; a sixth PMOS transistor that is coupled to the voltage rail at its source and the drain of the first PMOS transistor at its gate; a seventh PMOS transistor that is coupled to the voltage rail at its source and the drain of the second PMOS transistor at its gate; a first current minor that is coupled between the drains of the sixth and seventh PMOS transistors and at least one of the first and second steering circuits; a fifth NMOS transistor that is coupled to the drain of the sixth PMOS transistor at its drain, at least one of the first and second duty cycle correction circuits at its gate, and at least one of the first and second steering circuits; an eighth PMOS transistor that is coupled to the voltage rail at its source and the drain of the first PMOS transistor at its gate; a ninth PMOS transistor that is coupled to the voltage rail at its source and the drain of the second PMOS transistor at its gate; a second current mirror that is coupled between the drains of the eighth and ninth PMOS transistors and at least one of the first and second steering circuits; and a sixth NMOS transistor that is coupled to the drain of the ninth PMOS transistor at its drain, at least one of the first and second duty cycle correction circuits at its gate, and at least one of the first and second steering circuits at its source.

In accordance with a preferred embodiment of the present invention, each of the first and second steering circuits further comprises: a seventh NMOS transistor that receives a third bias voltage at its gate and that is coupled to ground at its source; and an eighth NMOS transistor that is coupled to the gate of at least one of the first and second NMOS transistors at its gate, the drain of the seventh NMOS transistor at its drain, and ground at its source.

In accordance with a preferred embodiment of the present invention, the bias voltage further comprises a first bias voltage, and wherein each of the first and second output stages and each of the first input stage further comprise: a fourth PMOS transistor that is coupled to the voltage rail at its source and that receives a second bias voltage at its gate; a fifth PMOS transistor that is coupled to the voltage rail at its source and that receives the second bias voltage at its gate; a third NMOS transistor that is coupled to the drain of the fourth PMOS transistor at its drain and at least one of the first and second steering circuits at its source and that receives at least one of the first and third signals at its gate; a fourth NMOS transistor that is coupled to the drain of the fifth PMOS transistor at its drain and at least one of the first and second steering circuits at its source and that receives the second signal at its gate; a first current mirror that is coupled to the voltage rail; a second current mirror that is coupled to the voltage rail; a third current mirror that is coupled to the first current minor, and the drain of the fifth PMOS transistor, and ground; a fourth current minor that is coupled to the second current mirror, and the drain of the fourth PMOS transistor, and ground; a third NMOS transistor that is coupled to the first current minor at its drain and at least one of the first and second duty cycle correction circuits at its gate; a fourth NMOS transistor that is coupled to the second current mirror at its drain and at least one of the first and second duty cycle correction circuits at its gate; and a fifth NMOS transistor that receives a second bias voltage at its gate, that is coupled to the sources of the third and fourth NMOS transistors at its drain, and that is coupled to ground at its source.

In accordance with a preferred embodiment of the present invention, each of the first and second steering circuits further comprises: a sixth NMOS transistor that receives a third bias voltage at its gate and that is coupled to ground at its source; and a seventh NMOS transistor that is coupled to the gate of at least one of the first and second NMOS transistors at its gate, the drain of the seventh NMOS transistor at its drain, and ground at its source.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
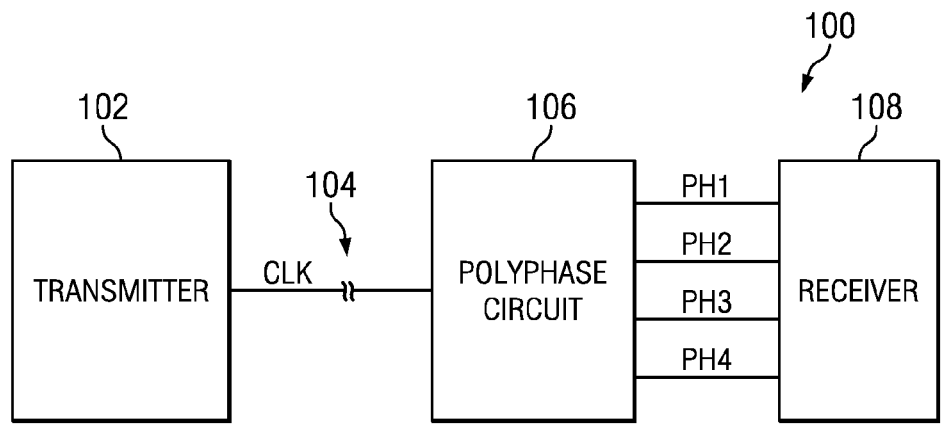
FIG. 1 is a circuit diagram of an example of a conventional system.

Refer now to the drawings wherein depicted elements are, for the sake of clarity, not necessarily shown to scale and wherein like or similar elements are designated by the same reference numeral through the several views.

Figure 2:
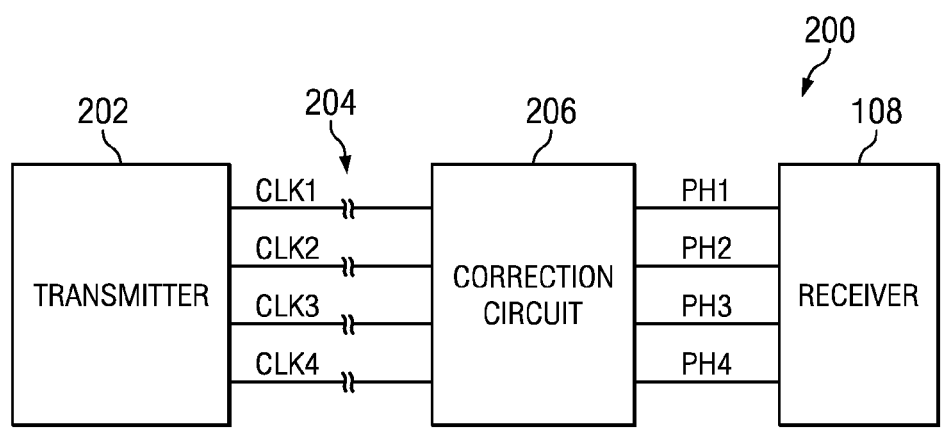
FIG. 2 is a circuit diagram of an example of a system in accordance with a preferred embodiment of the present invention.

Turning to FIG. 2, an example of a system 200 in accordance with a preferred embodiment of the present invention can be seen. System 200 is different from system 100 in that transmitter 202 provides the I channel (clocks signals CLK1 and CLK3) and Q channel (clock signals CLK2 and CLK4) over transmission medium 204 (which can be up to several millimeters in length). A correction circuit 206 receives these clock signals CLK1 to CLK4 and corrects for quadrature skew and duty cycle distortion to locally generate signals PH1 to PH4 for receiver 108. Additionally, clock signals CLK1 to CLK4 generally correspond to 0°, 90°, 180°, and 270° phases of a master or initial clock signal (i.e., clock signal CLK from FIG. 1).

Figure 3:
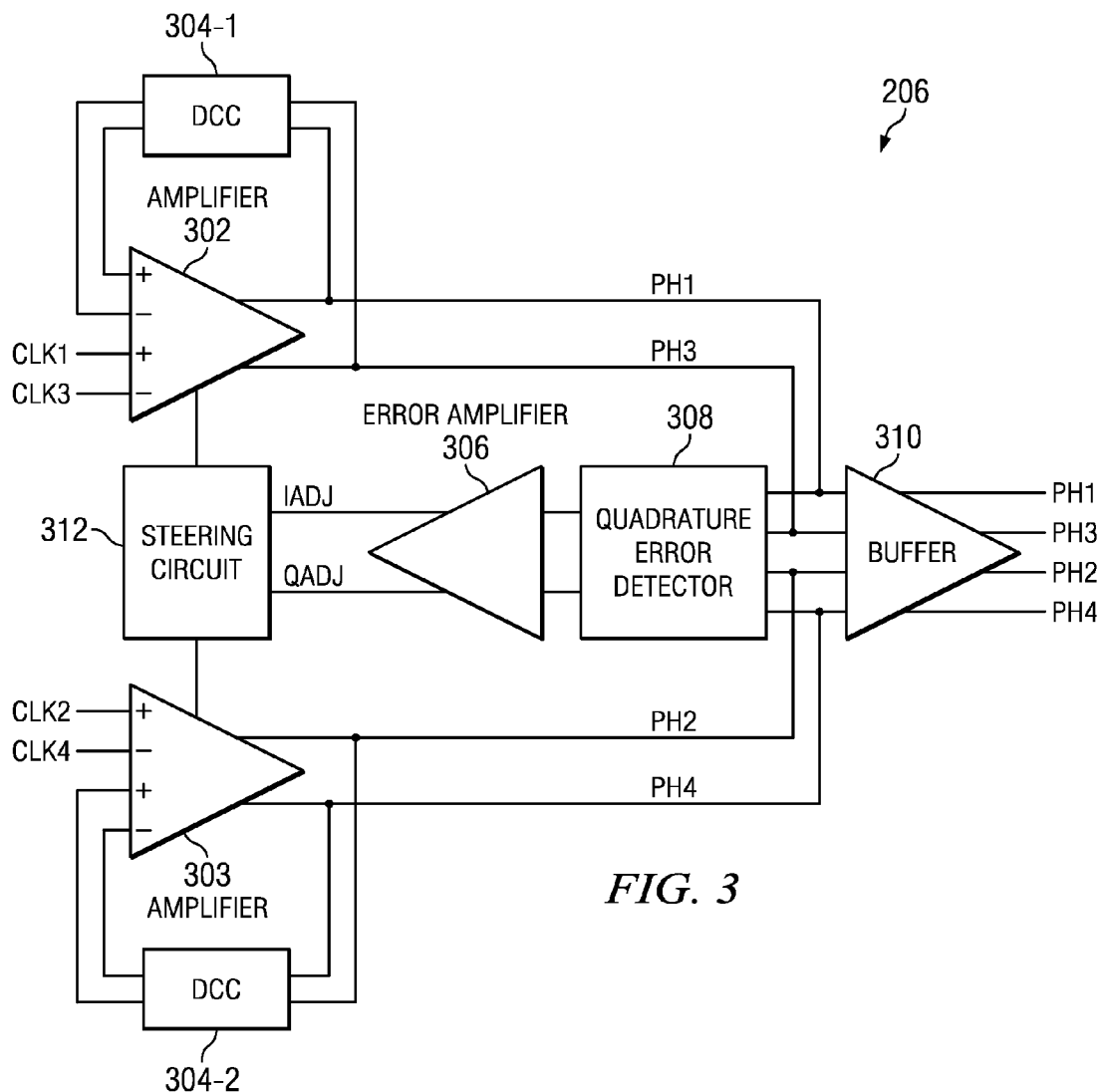
FIG. 3 is a circuit diagram of an example of the correction circuit of FIG. 2.

In FIG. 3, an example of the correction circuit 206 can be seen in greater detail. As shown, the correction circuit 206 generally comprises amplifiers 302 and 303, duty cycle correction circuits (or DCC) 304-1 and 304-2, quadrature error detector 308, error amplifier 306, steering circuit 312, and buffer 310 that are arranged into a set of inner loops and an outer loop. The inner loops generally correct for duty cycle distortion by using feedback from the duty cycle correction circuits 304-1 and 304-2, and the output loop, on the other hand, generally corrects for quadrature skew by using feedback from the quadrature error detector 308, error amplifier 306 and steering circuit 312. Additionally, the inner loops typically settle faster than the outer loop.

Looking first to the inner or duty cycle correction loop, "opposite" clock phases CLK1/CLK3 or CLK2/CLK4 (which generally correspond to differential I and Q channels, respectively) are used. As shown in FIG. 3, each of amplifiers 302 and 303 receives one of the pairs of "opposite" phase clock signals CLK1/CLK3 or CLK2/CLK4. A reason for using the "opposite" phases is that any overlaps in the "phases" can indicate an error in duty cycle. The duty cycle correction circuits 304-1 and 304-2 can then generate a correction feedback for amplifiers 302 and 303, respectively, based on any overlap. For example, if there is an overlap between the "ON" times of clock signal CLK1 (0° phase) and clock signal CLK3 (180° phase), the duty cycle of one of these clock signals CLK1 or CLK3 may be too long, which can be corrected through feedback to amplifier 302. These inner loops can then converge when signals PH1 and PH3 (for the I channel) and signals PH2 and PH4 (for Q channel) have about 50% duty cycle.

The outer loop operates on a different principal. For the phase difference ($_\Delta\Phi_{in}$) between the I and Q channels and the phase difference ($_\Delta\Phi_{out}$) of the output clocks signals PH1/PH2 and PH3/PH4, the following control equation can be used to model the outer loop:

$$(_\Delta\Psi_{in} - \pi/2) - (_\Delta\Psi_{out} - \pi/2)H(s)A*2\pi F\Delta t =\, _\Delta\Psi_{out}, \qquad (1)$$

where F is the clock frequency, $\Delta t$ is the delay stage coefficient, A is loop gain, and H(s) is the transfer function. By collecting terms for equation (1), the following equation can be obtained:

$$_\Delta\Psi_{out} = \frac{_\Delta\Psi_{in} - \pi/2}{1 + H(s)A*2\pi F\Delta t} + \frac{\pi}{2}\frac{H(s)A*2\pi F\Delta t}{1 + H(s)A*2\pi F\Delta t} \qquad (2)$$

As can be seen in equation (2), the initial input quadrature error can be suppressed by the loop gain (A), which can also maintain the phase difference of the output I/Q clock at $\pi/2$. The outer loop can basically be a high pass system and can be implemented as a first order loop. Higher order loops can also be implemented to reduce control voltage ripple by including some additional resistor-capacitor (RC) networks to the charge pump 408 (shown below) or adding one more gain stages with an RC network after the quadrature error detector 308. The latter will allow some more freedom to control gain and level shifting.

Figure 4:
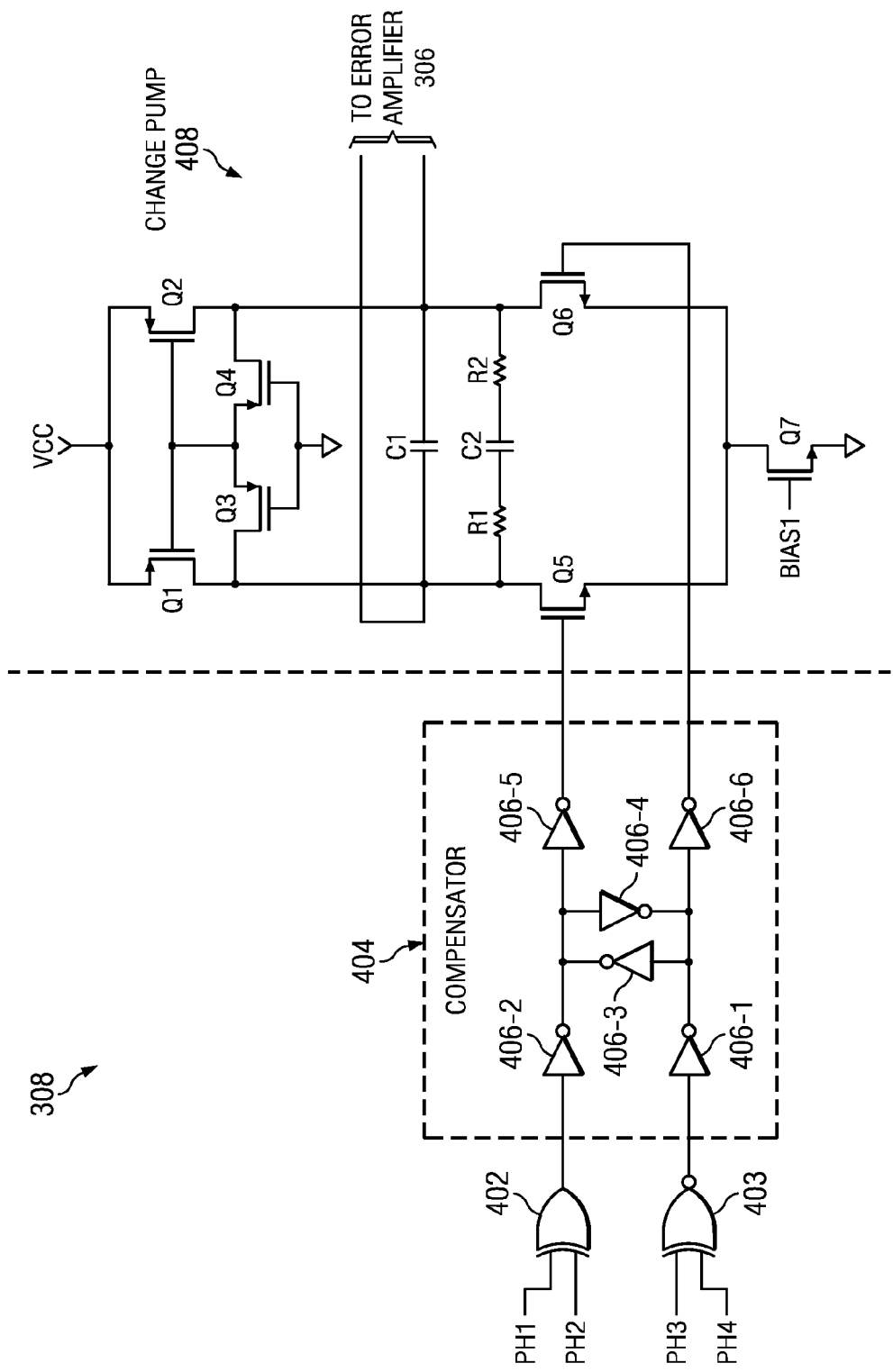
FIG. 4 is a circuit diagram of an example of the quadrature error detector of FIG. 3.

Now, turning to FIG. 4, an example of the quadrature error detector 308 (which is part of the outer loop) can be seen in greater detail. In contrast to the inner loops, the output loop, and more particularly, the quadrature error detector 308 compares adjacent phase clock signals PH1/PH2 and PH3/PH4. As shown, the quadrature error detector 308 generally comprises a logic circuit (i.e., XOR gate 402 and XNOR gate 403), a compensator 404 (i.e., inverters 406-1 to 406-6), and a charge pump 408 (i.e., PMOS transistors Q1 through Q4, NMOS transistors Q3 through Q7, capacitors C1 and C2, resistors R1 and R2, and bias voltage BIAS1 received at the gate of transistor Q7). In operation, XOR gate 403 and XNOR gate 403 convert a skew error into duty cycle errors. Typically, the outputs of XOR gate 403 and XNOR gate 403 are each a complementary square waves having twice the input frequency with a duty cycle that depends on the relative phase between the I and Q inputs. The resultant duty cycle should vary between 0% and 100%, being 50% if I and Q phases are in quadrature (phase difference 90°), and the differential input to the charge pump 408 should have average value that varies as a function of the relative phase, being 0 when the I/Q phase is at 90°. The charge pump 408 generally integrates and filters the differential input from the logic circuit (i.e., XOR gate 402 and XNOR gate 403) so as to convert the differential input into a differential control voltage signal (for error amplifier 306) based on the input duty cycle. For charge pump 408, when duty cycle is 50%, the charging and discharging periods are generally equal so that little to no charge will accumulate across capacitor C2. When the duty cycle differs from 50%, the charging and discharging periods are generally imbalanced, charging capacitor C2. The series resistors R1 and R2 and parallel capacitor C1 serve to further adjust the frequency properties of the charge pump for accuracy and loop stability inside the outer loop. The compensator 404 generally includes a pair of cross-coupled inverter 406-3 and 406-4 (which are coupled between inverters 406-2/406-5 and 406-1 and 406-6) to generally eliminate skew error introduced by the mismatch between XOR and XNOR gates 402 and 403 so as to increases the accuracy of the quadrature skew detecting.

Figure 5:
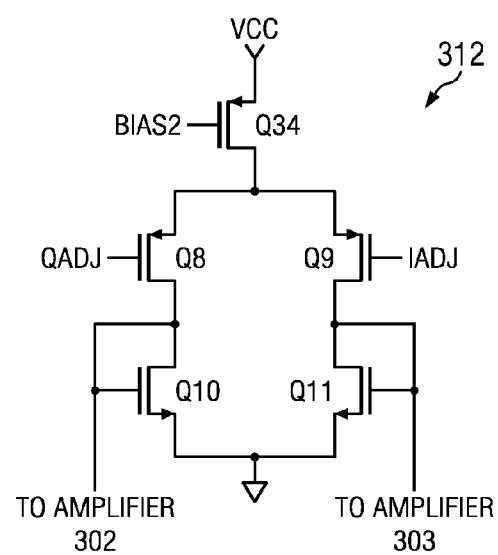
FIG. 5 is a circuit diagram of an example of the steering circuit of FIG. 3.

Turning to FIG. 5, an example of the steering circuit 312 can be seen in greater detail. The steering circuit 312 generally comprises a bias transistor Q39 (which can be a PMOS transistor that is coupled to a voltage rail (i.e., VCC) and which and which receives a bias voltage BIAS2), a differential input pair Q8 and Q9 (which can be PMOS transistors), and diode-connected transistors Q10 and Q11 (which can be NMOS transistors). The differential input pair Q8 and Q9 receive signals IADJ and QADJ signals, which are issued from charge pump 408 and amplified by error amplifier 306, and the resulting currents (from transistors Q8 and Q9) control the tail currents in amplifiers 302 and 303 through diode-connected transistors Q10 and Q11.

Figure 6:
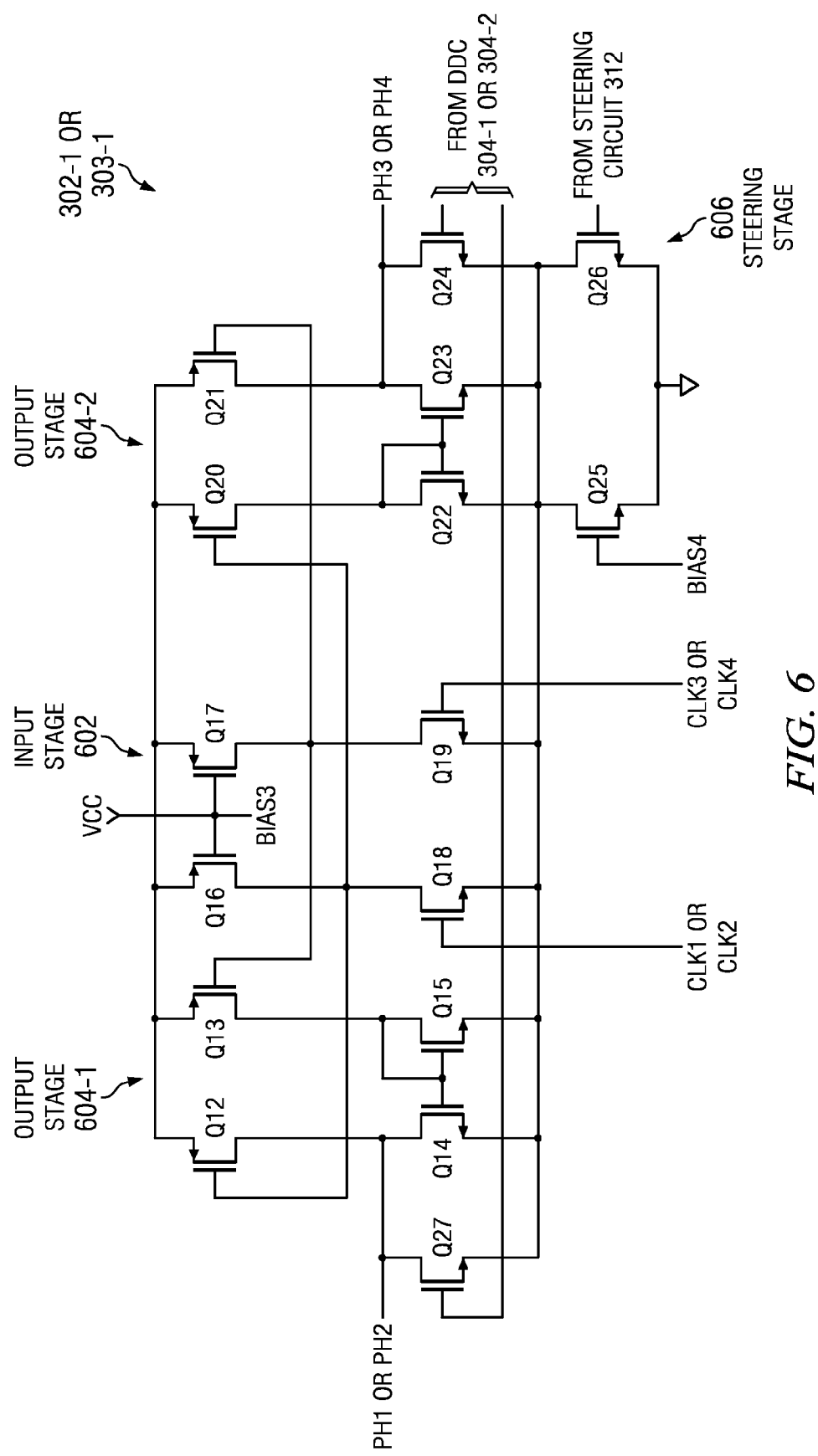
FIGS. 6 and 7 are circuit diagrams of examples of the amplifiers of FIG. 3.

In FIG. 6, an example of amplifier 302 or 303 (labeled 302-1 or 303-1) can be seen in greater detail. As shown, amplifier 302-1 or 303-1 generally comprises an input stage 602, a steering stage 606, and output stages 604-1 and 604-2 (which are typically differential delay elements). For input stage 602, differential input transistors Q18 and Q19 (which can be NMOS transistors) are cascoded with bias transistors Q16 and Q17 (which receive bias voltage BIAS3 and which can be PMOS transistors). Each of output stages 604-1 and 604-2 generally comprises differential input transistors Q12/Q13 and Q20/Q21 (that are each generally coupled to the input stage 602), current minors Q14/Q15 and Q22/Q23 (which are each generally coupled to the respective differential input transistors Q12/Q13 or Q20/Q21), and a control transistors Q24 and Q27 (which receive control signals from the respective duty cycle control circuit 304-1 or 304-2 to vary the delay of the output stages 604-1 or 604-2 accordingly). Typically, the duty cycle correction circuits 304-1 and 304-2 measure duty cycle distortion of signals PH1 to PH4 and correct the distortion by changing the switching threshold of the output stages 604-1 and 604-2 for each of amplifiers 302-1 and 303-1. The steering circuit 606 generally comprises a bias transistor Q25 (which receives a bias voltage BIAS4 and which can be an NMOS transistor) and a transistor Q26 (which can be an NMOS transistor and collectively with transistor Q10 or Q11 can form a current mirror to control the tail current in amplifier 302 or 303). The change in bias current (through steering stage 606) can affects the common mode output and, in turn, changes the relative delay of the I and Q paths, speeding up one while slowing down the other. The delay input stages (i.e., 604-1 and 604-2) are typically biased at nominal currents to generally prevent the outer loop from saturating. Additionally, using separate physical paths for the inner and outer loops generally insures the two control mechanisms work with minimal interaction.

Figure 7:
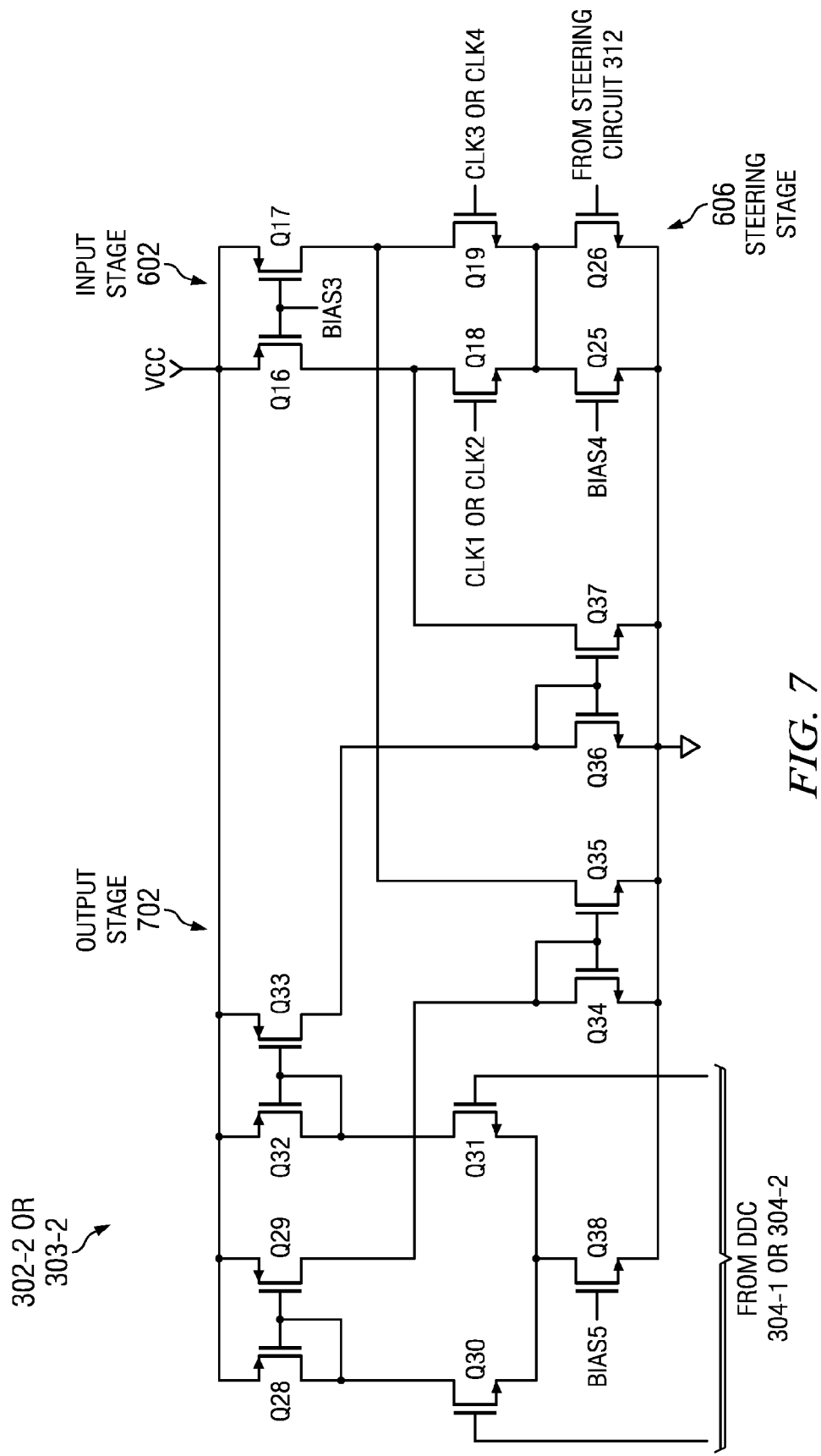

Turning to FIG. 7, an alternative arrangement for amplifier 302 or 303 (labeled 302-2 or 303-2) can be seen in greater detail. Here, the difference between amplifier 302-1 or 303-1 and amplifier 302-2 or 302-3 lies in the output stage 702. This output stage 702 is not generally controlled by steering stage 606 (as the output stages 604-1 and 604-2 are in amplifier 302-1 or 303-1). Output stage 702 generally comprises differential input transistors Q30 and Q31 (which receive signals from duty cycle correction circuit 304-1 or 304-2 and which may be NMOS transistors), a bias transistor Q38 (which receives bias voltage BIAS5 and which can be an NMOS transistor), and current minors Q28/29, Q32/Q33, Q34/Q35, and Q36/Q37. In operation, duty cycle error is detected by an integrator in the duty cycle correction circuit 304-1 or 304-2, and the error is corrected by DC offset adjustment voltages applied to transistors Q30 and Q31. Quadrature error is corrected by adjusting the tail current in steering stage 606 to accelerate or decelerate the slew rate. Additionally, bias voltage BIAS5 can provide a residue current for during start up.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a plurality of inner correction loops that each receive a pair of input signals and that each perform duty cycle correction for its pair of input signals; and
   an outer correction loop that is coupled to each of the inner correction loops, wherein the outer correction loops deskews each pair of input signals.

2. The apparatus of claim 1, wherein each inner correction loop further comprises:
   an amplifier that receives its pair of input signals; and
   a duty cycle correction circuit that is coupled to the amplifier.

3. The apparatus of claim 1, wherein the outer correction loop further comprises:
   an error detector that is coupled to each of the inner correction loops;
   an error amplifier that is coupled to the error detector; and
   a steering circuit that is coupled to the error amplifier and to each of the inner control loops.

4. The apparatus of claim 3, wherein the error detector further comprises:
   a logic circuit that is coupled to each of the inner correction loops;
   a compensator that is coupled to the logic circuit; and
   a charge pump that is coupled between the compensator and the error amplifier.

5. An apparatus comprising:
   a first amplifier that receives a first signal and a second signal;
   a second amplifier that receives a third signal and a fourth signal;
   a first duty cycle correction circuit that is coupled to the first amplifier;
   a second duty cycle correction circuit that is coupled to the second amplifier;
   an error detector that is coupled to the first amplifier and the second amplifier, wherein the error detector detects skew;
   a error amplifier that is coupled to the error detector; and
   a steering circuit that is coupled to the error amplifier, the first amplifier, and the second amplifier.

6. The apparatus of claim 5, wherein the error detector further comprises:
   a logic circuit that is coupled to the first and second amplifiers;
   a compensator that is coupled to the logic circuit; and
   a charge pump that is coupled between the compensator and the error amplifier.

7. The apparatus of claim 6, wherein the logic circuit further comprises:
   an XOR gate that is coupled between the first amplifier and the compensator; and an XNOR gate that is coupled between the second amplifier and the compensator.

8. The apparatus of claim 7, wherein the compensator further comprises:
a first inverter that is coupled to the XOR gate;
a second inverter that is coupled to the XNOR gate;
a third inverter that is coupled between the first inverter and the charge pump;
a fourth inverter that is coupled between the second inverter and the charge pump; and
a pair of cross-coupled inverters coupled to a node between the first and third inverters and to a node between the second and fourth inverters.

9. The apparatus of claim 5, wherein each of the first and second amplifier further comprises:
an input stage;
an output stage that is coupled to the input stage, at least one of the first and second duty cycle correction circuits, and the error detector; and
a steering stage that is coupled to the input stage and the steering circuit.

10. The apparatus of claim 9, wherein the input stage further comprises:
a pair of bias transistors that are each coupled to a voltage rail;
a pair of differential input transistors, wherein each transistor of the pair is coupled to one of the bias transistors and to the steering stage.

11. The apparatus of claim 10, wherein the steering stage further comprises a steering transistor that is coupled between the input stage and ground and that is coupled to the steering circuit.

12. The apparatus of claim 11, wherein the output stage further comprises a plurality of output stages, and wherein each output stage is coupled to the steering stage.

13. An apparatus comprising:
a first amplifier having:
  a first input stage that receives a first signal and a second signal;
  a first output stage that is coupled to the first input stage; and
  a first steering stage that is coupled to the first input stage;
a second amplifier having:
  a second input stage that receives a third signal and a fourth signal;
  a second output stage that is coupled to the second input stage; and
  a second steering stage that is coupled to the second input stage;
a first duty cycle correction circuit that is coupled to the first output stage of the first amplifier;
a second duty cycle correction circuit that is coupled to the second output stage of the second amplifier;
an error detector having:
  a first logic gate that is coupled to the first output stage of the first amplifier;
  a second logic gate that is coupled to second output stage of the second amplifier;
  a compensator that is coupled to the first and second logic gates; and
  a charge pump that is coupled to the compensator;
a error amplifier that is coupled to the charge pump of the error detector; and
a steering circuit that is coupled to the error amplifier, first steering stage of the first amplifier, and the second steering stage of the second amplifier.

14. The apparatus of claim 13, wherein the first logic gate further comprises an XOR gate, and wherein the second logic gate further comprises an XNOR gate, and wherein the compensator further comprises:
a first inverter that is coupled to the XOR gate;
a second inverter that is coupled to the XNOR gate;
a third inverter that is coupled between the first inverter and the charge pump;
a fourth inverter that is coupled between the second inverter and the charge pump; and
a pair of cross-coupled inverters coupled to a node between the first and third inverters and to a node between the second and fourth inverters.

15. The apparatus of claim 14, wherein the steering circuit further comprises:
a first PMOS transistor that is coupled to a voltage rail at its source and that receives a bias voltage at its gate;
a second PMOS transistor that is coupled to the drain of the first PMOS transistor at its source and that is coupled to the error amplifier at its gate;
a third PMOS transistor that is coupled to the drain of the first PMOS transistor at its source and that is coupled to the error amplifier at its gate;
a first NMOS transistor that is coupled to the drain of the second PMOS transistor at its drain and gate and that is coupled to ground at its source; and
a second NMOS transistor that is coupled to the drain of the third PMOS transistor at its drain and gate and that is coupled to ground at its source.

16. The apparatus of claim 14, wherein the bias voltage further comprises a first bias voltage, and wherein each of the first and second output stages and each of the first input stage further comprise:
a fourth PMOS transistor that is coupled to the voltage rail at its source and that receives a second bias voltage at its gate;
a fifth PMOS transistor that is coupled to the voltage rail at its source and that receives the second bias voltage at its gate;
a third NMOS transistor that is coupled to the drain of the fourth PMOS transistor at its drain and at least one of the first and second steering circuits at its source and that receives at least one of the first and third signals at its gate;
a fourth NMOS transistor that is coupled to the drain of the fifth PMOS transistor at its drain and at least one of the first and second steering circuits at its source and that receives the second signal at its gate;
a sixth PMOS transistor that is coupled to the voltage rail at its source and the drain of the first PMOS transistor at its gate;
a seventh PMOS transistor that is coupled to the voltage rail at its source and the drain of the second PMOS transistor at its gate;
a first current mirror that is coupled between the drains of the sixth and seventh PMOS transistors and at least one of the first and second steering circuits;
a fifth NMOS transistor that is coupled to the drain of the sixth PMOS transistor at its drain, at least one of the first and second duty cycle correction circuits at its gate, and at least one of the first and second steering circuits;
an eighth PMOS transistor that is coupled to the voltage rail at its source and the drain of the first PMOS transistor at its gate;
a ninth PMOS transistor that is coupled to the voltage rail at its source and the drain of the second PMOS transistor at its gate;

a second current mirror that is coupled between the drains of the eighth and ninth PMOS transistors and at least one of the first and second steering circuits; and a sixth NMOS transistor that is coupled to the drain of the ninth PMOS transistor at its drain, at least one of the first and second duty cycle correction circuits at its gate, and at least one of the first and second steering circuits at its source.

17. The apparatus of claim 16, wherein each of the first and second steering circuits further comprises:

a seventh NMOS transistor that receives a third bias voltage at its gate and that is coupled to ground at its source; and an eighth NMOS transistor that is coupled to the gate of at least one of the first and second NMOS transistors at its gate, the drain of the seventh NMOS transistor at its drain, and ground at its source.

18. The apparatus of claim 14, wherein the bias voltage further comprises a first bias voltage, and wherein each of the first and second output stages and each of the first input stage further comprise:

a fourth PMOS transistor that is coupled to the voltage rail at its source and that receives a second bias voltage at its gate;

a fifth PMOS transistor that is coupled to the voltage rail at its source and that receives the second bias voltage at its gate;

a third NMOS transistor that is coupled to the drain of the fourth PMOS transistor at its drain and at least one of the first and second steering circuits at its source and that receives at least one of the first and third signals at its gate;

a fourth NMOS transistor that is coupled to the drain of the fifth PMOS transistor at its drain and at least one of the first and second steering circuits at its source and that receives the second signal at its gate;

a first current mirror that is coupled to the voltage rail;

a second current mirror that is coupled to the voltage rail;

a third current mirror that is coupled to the first current mirror, and the drain of the fifth PMOS transistor, and ground;

a fourth current mirror that is coupled to the second current mirror, and the drain of the fourth PMOS transistor, and ground;

a third NMOS transistor that is coupled to the first current mirror at its drain and at least one of the first and second duty cycle correction circuits at its gate;

a fourth NMOS transistor that is coupled to the second current mirror at its drain and at least one of the first and second duty cycle correction circuits at its gate; and a fifth NMOS transistor that receives a second bias voltage at its gate, that is coupled to the sources of the third and fourth NMOS transistors at its drain, and that is coupled to ground at its source.

19. The apparatus of claim 18, wherein each of the first and second steering circuits further comprises:

a sixth NMOS transistor that receives a third bias voltage at its gate and that is coupled to ground at its source; and a seventh NMOS transistor that is coupled to the gate of at least one of the first and second NMOS transistors at its gate, the drain of the seventh NMOS transistor at its drain, and ground at its source.

* * * * *